United States Patent [19]

Taniai et al.

[11] Patent Number: 5,033,017
[45] Date of Patent: Jul. 16, 1991

[54] PROGRAMMABLE LOGIC ARRAY WITH REDUCED POWER CONSUMPTION

[75] Inventors: Takayoshi Taniai; Tadashi Saitoh, both of Kawasaki; Yasuhiro Tanaka, Koshigaya, all of Japan

[73] Assignees: Fujitsu Limited; Fujitsu Microcomputer Systems Limited, both of Kawasaki, Japan

[21] Appl. No.: 333,939

[22] Filed: Apr. 6, 1989

[30] Foreign Application Priority Data

Apr. 11, 1988 [JP] Japan .................................. 63-88592

[51] Int. Cl.⁵ .............................................. G06F 7/38
[52] U.S. Cl. .................................................. 364/716
[58] Field of Search ................ 364/716, 200 MS File; 307/407, 465; 368/82

[56] References Cited

U.S. PATENT DOCUMENTS

| | | | |
|---|---|---|---|
| 3,896,418 | 7/1975 | Brown | 364/200 |
| 4,262,352 | 4/1981 | Kobayashi et al. | 368/82 |
| 4,317,180 | 2/1982 | Lies | 364/707 |
| 4,721,868 | 1/1988 | Cornell et al. | 364/716 |
| 4,812,685 | 3/1989 | Anceau | 307/465 |
| 4,831,285 | 5/1989 | Gaiser | 307/465 |
| 4,839,539 | 6/1989 | Takata et al. | 364/716 |

FOREIGN PATENT DOCUMENTS

| | | |
|---|---|---|
| 0050884A1 | 5/1982 | European Pat. Off. . |
| 0145320A2 | 6/1985 | European Pat. Off. . |
| 52-137228 | 11/1977 | Japan . |
| 52-137229 | 11/1977 | Japan . |
| 59-208944 | 11/1984 | Japan . |

Primary Examiner—Dale M. Shaw
Assistant Examiner—Long T. Nguyen
Attorney, Agent, or Firm—Armstrong, Nikaido, Marmelstein, Kubovcik, & Murray

[57] ABSTRACT

A programmable logic array includes a programmable logic array being precharged and discharged in synchronism with a clock signal supplied thereto and outputting an operation result with respect to input data supplied thereto. The programmable logic array also includes a circuit connected to the programmable logic array, for holding the programmable logic array in a precharged state by setting the clock signal to a fixed level when the programmable logic array is not selected and for switching the programmable logic array to a discharged state by supplying the clock signal the programmable logic array when the programmable logic array is selected, so that the programmable logic array is discharged on the basis of the contents of the input data when selected.

14 Claims, 8 Drawing Sheets

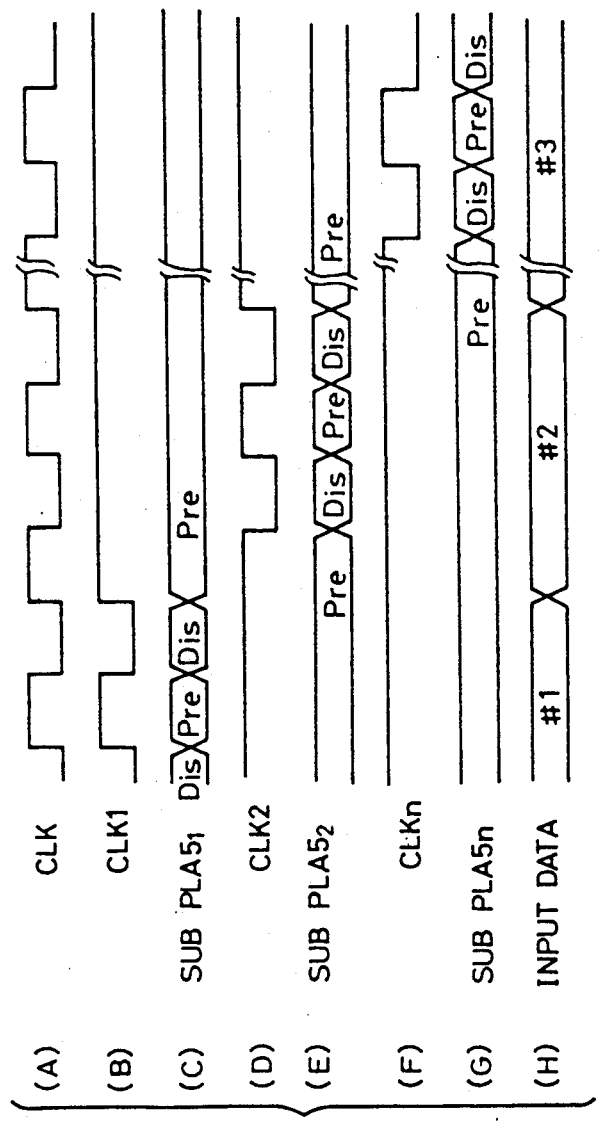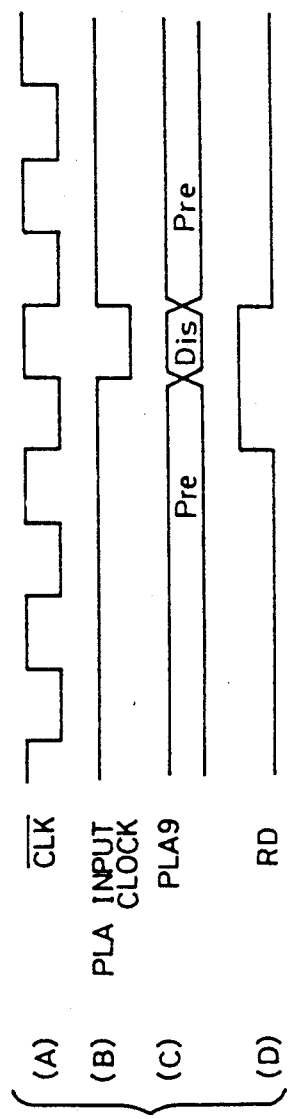

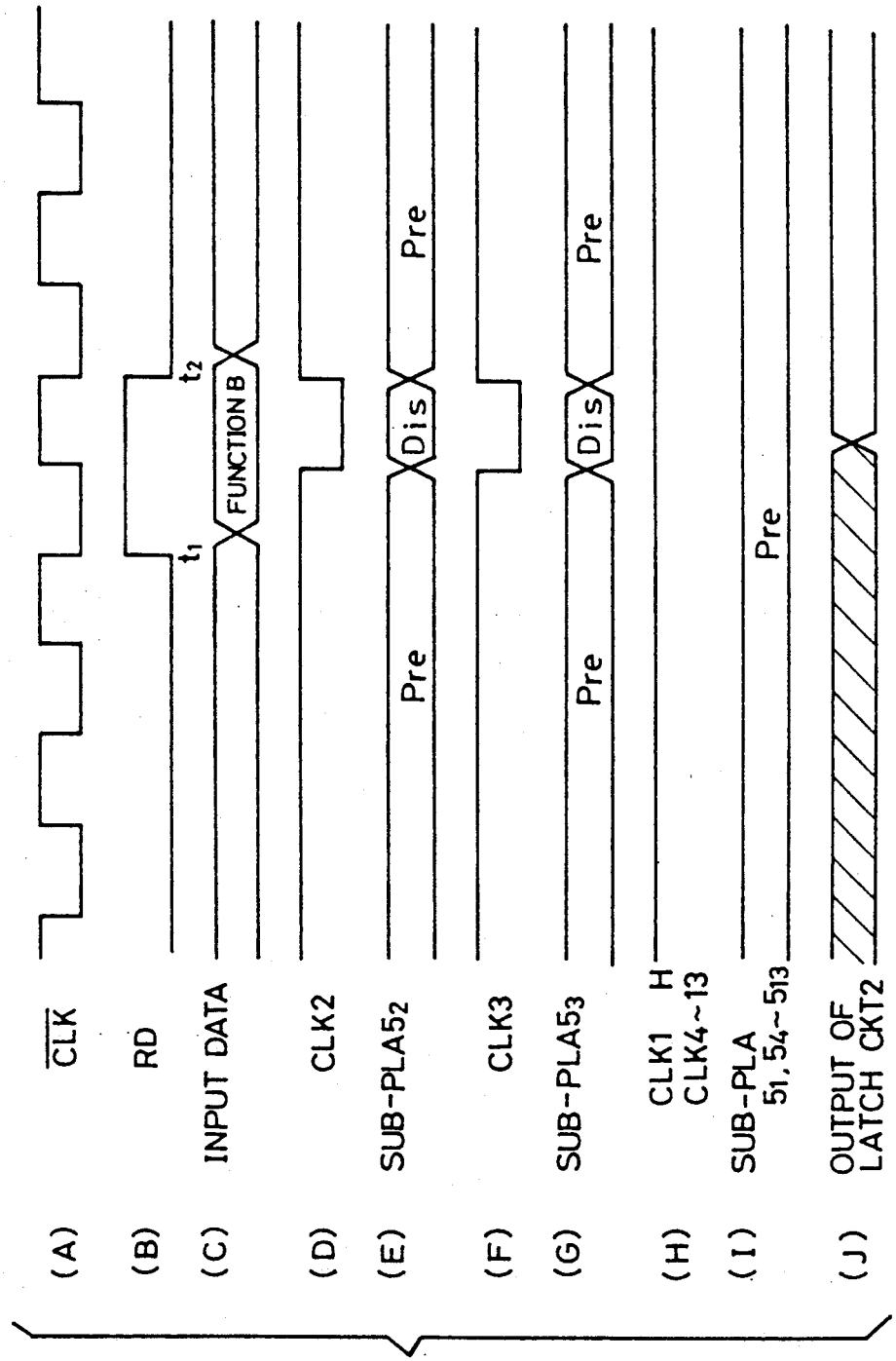

FIG. 9

| | A | B | C | D | E | F | G | H | I | J | SELECT CONDITION |
|---|---|---|---|---|---|---|---|---|---|---|---|
| Sub-PLA 5₁ | 131 | | | | | | | | | | A |
| Sub-PLA 5₂ | 27 | 104 | | | | | | | | | A·B |
| Sub-PLA 5₃ | | 28 | 103 | | | | | | | | B·C |
| Sub-PLA 5₄ | | | 29 | 102 | | | | | | | C·D |
| Sub-PLA 5₅ | | | | 131 | | | | | | | D |
| Sub-PLA 5₆ | | | | 101 | 30 | | | | | | D·E |
| Sub-PLA 5₇ | | | | | 131 | | | | | | E |
| Sub-PLA 5₈ | | | | | 131 | | | | | | E |
| Sub-PLA 5₉ | | | | | | 131 | | | | | F |
| Sub-PLA 5₁₀ | | | | | | 10 | 121 | | | | F·G |
| Sub-PLA 5₁₁ | | | | | | | 21 | 51 | 59 | | G·H·I |
| Sub-PLA 5₁₂ | | | | | | | | | 22 | 109 | I·J |
| Sub-PLA 5₁₃ | | | | | | | | | | 81 | J |

PROGRAMMABLE LOGIC ARRAY WITH REDUCED POWER CONSUMPTION

BACKGROUND OF THE INVENTION

The present invention generally relates to a programmable logic array, and more particularly to a reduction in power consumed in a programmable logic array.

As is well known, a programmable logic array (hereafter simply referred to as a PLA) is a circuit in which a desired logical function can be programed. A PLA has such a structure that circuit elements are regularly arranged as conventional memories.

A conventional PLA is described with reference to FIGS. 1 and 2. Referring to these figures, a PLA 1 includes an OR array and an AND array, each of which includes precharge transistors and discharge transistors. A clock signal CLK as shown in FIG. 2(A) is applied to the PLA 1. When the clock signal CLK is held at a high level (hereafter simply referred to H level), the PLA 1 is precharged. On the other hand, when the clock signal CLK is held at a low level (hereafter simply referred to as L level), the PLA 1 is discharged. Therefore, the state of the PLA changes as shown in FIG. 2(B) where "Pre" indicates a precharged state, and "Dis" indicates a discharged state.

The PLA 1 enters data supplied to an input data terminal IN thereof in the precharged state, and outputs a logic output to a latch circuit 2 in the discharged state. An AND gate 3 makes an AND operation on an inverted clock pulse signal $\overline{CLK}$ and a read signal RD as shown in FIG. 2(C), and generates a control signal. The latch circuit 2 latches a logic output from the PLA 1 at the rise of the inverted clock pulse signal $\overline{CLK}$. Therefore, the output signal of the latch circuit 2 changes with a timing as shown in FIG. 2(D).

As is illustrated in FIG. 2(B), the precharging and discharging are alternately carried out all the time. This means that the PLA 1 is always accessed, or in other words, the PLA 1 is accessed during a time even when it is not required to read data from the PLA 1. The above-mentioned access operation is wasteful of power, since current passes through discharge transistors during discharge periods even when the PLA 1 is not accessed. Recently, PLAs are fabricated as large scale integrated circuits. Therefore, it is particularly desired that power consumption is as low as possible.

In view of reduction of power consumed in PLAs, an improvement in configuration of PLAs has been proposed (see Japanese Laid-Open Patent Application Nos. 52-137228, 52-137229 and 59-208944). In the proposed improvement, a PLA is divided into a plurality of blocks (sub-PLAs). A divided block to be selected is supplied with power, and the remaining blocks (which are not selected) are supplied with no power. For this purpose, ON/OFF switches are interposed between a power source line and the divided blocks of the PLA. In the alternative, a divided block of an OR array which is not selected at present, is inhibited from being precharged.

However, as will be described later, problems occur by simply turning the power source OFF. Additionally, when the block of the OR array which is not currently selected, is selected, the selected block must be subjected to the precharging operation. This leads to a decrease of operation speed.

SUMMARY OF THE INVENTION

It is therefore a general object of the present invention to provide a programmable logic array in which the above-mentioned disadvantages are eliminated.

A more specific object of the present invention is to provide a programmable logic array with reduced power consumption and higher speed.

The above objects of the present invention can be achieved by a programmable logic array comprising a programmable logic array being precharged and discharged in synchronism with a clock signal supplied thereto and outputting an operation result with respect to input data supplied thereto; and a device connected to the programmable logic array, for holding the programmable logic array in a precharged state by setting the clock signal to a fixed level when the programmable logic array is not selected and for switching the programmable logic array to a discharged state by supplying the clock signal to the programmable logic array when the programmable logic array is selected, so that the programmable logic array is discharged on the basis of the contents of the input data when selected.

Other objects, features and advantages of the present invention will become apparent from the following detailed description when read in conjunction with the accompanying drawings.

BRIEF DESCRIPTION OF THE DRAWINGS

FIG. 5 is a timing chart of signals relating to the structure of FIG. 3:

FIG. 6 is a timing chart of signals relating to the structure of FIG. 4;

FIG. 8 is a timing chart illustrating operation of the embodiment of FIG. 7A;

FIG. 9 is a view illustrating relationship between available functions and sub-PLAs in the embodiment;

DESCRIPTION OF THE PREFERRED EMBODIMENTS

Figure 3:
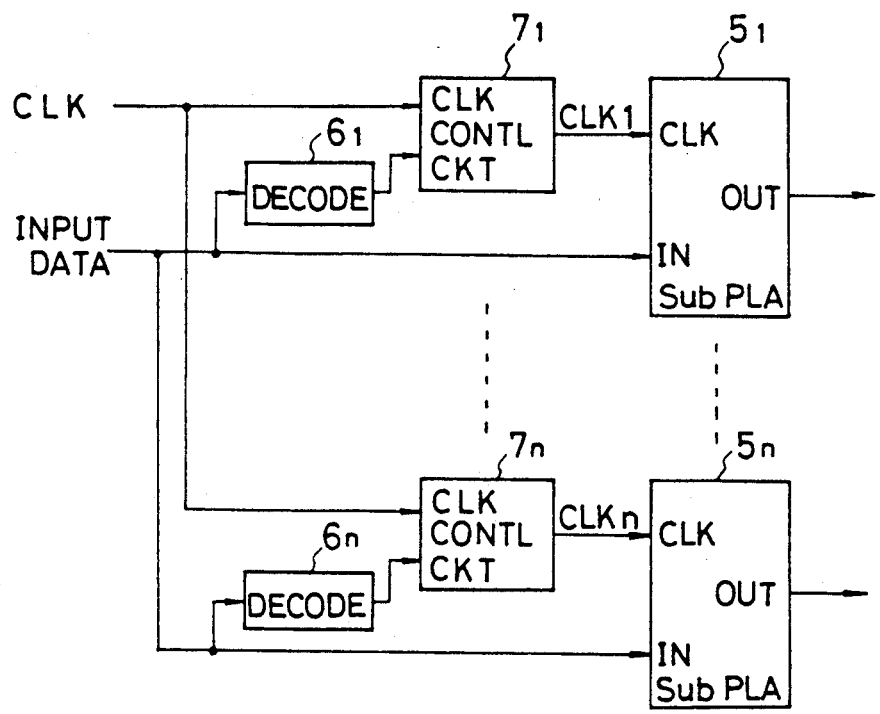
FIG. 3 is a block diagram illustrating a basic structure of the present invention.

A description is given of the basic structure of the present invention with reference to FIGS. 3 and 5. Referring to FIG. 3, the illustrated PLA includes a plurality of sub-PLAs $5_1$ through $5_n$, which are formed by dividing a PLA into portions, depending on functions. Decoders $6_1$ through $6_n$, which are provided with corresponding sub-PLAs $5_1$ through $5_n$, determine whether or not the corresponding sub-PLAs $5_1$ through $5_n$ are selected based on input data supplied thereto. Clock control circuits $7_1$ through $7_n$ associated with the sub-PLAs $5_1$ through $5_n$ are provided with output signals of the decoders $6_1$ through $6_n$ and a clock pulse signal CLK shown in FIG. 5(A). Then, the clock control circuits $7_1$ through $7_n$ generate corresponding clock pulse signals CLK1 through CLKn (FIG. 5(B)), which are to be supplied to clock input terminals CLK of the corresponding sub-PLAs $5_1$ through $5_n$, only when the clock control circuits $7_1$ through $7_n$ determine that the corresponding sub-PLAs $5_1$ through $5_n$ are selected.

In operation, input data includes information on functions to be executed as shown in FIG. 5(H). Functions #1, #2 and #n relate to the sub-PLA $5_1$, $5_2$ and $5_n$, respectively. For example, when the input data includes information which indicates function #1, the decoder $6_1$ outputs a control signal to activate the clock control circuit $7_1$ associated with the sub-PLA $5_1$. Thereby, as shown in FIGS. 5(A) and 5(B), the clock control circuit $7_1$ generates the clock pulse signal CLK1 by simply passing through the clock pulse signal CLK supplied thereto. As a result, the sub PLA $5_1$ is alternately switched to the precharged state and discharged state in synchronism with the clock pulse signal CLK1, as shown in FIG. 5(C). Then, the input data becomes indicative of another function (function #2 for the illustrated example), the clock control circuit $7_1$ holds the level of the clock pulse signal CLK1 high. Thereby, the PLA $5_1$ is kept in the precharged state, as shown in FIG. 5(C). Of course, before the input data becomes indicative of function #1, the sub-PLA $5_1$ is kept in the precharged state. The other sub-PLAs $5_2$ through $5_n$ operate in the same way as the sub-PLA $5_1$. It is noted that each of the sub-PLAs $5_1$ through $5_n$ is alternately switched to the discharged and precharged states only when it is selected, and is kept in the precharged state when not selected. As a result, it is possible to reduce power consumption resulting from current passing through discharge transistors during non-selected state. In the structure of FIG. 3, the sub-PLA $5_1$ through $5_n$ are periodically selected.

Figure 4:
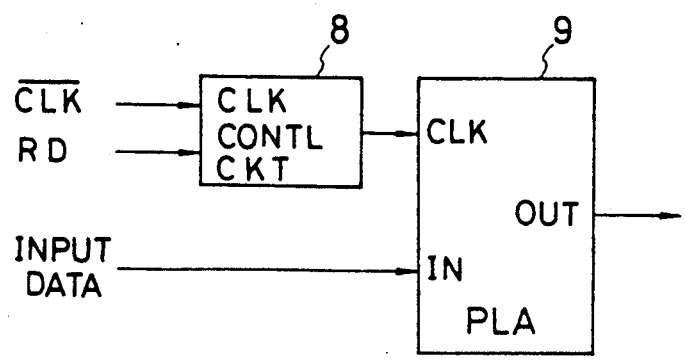
FIG. 4 is a block diagram illustrating another basic structure of the present invention.

Another basic structure of the present invention is described with reference to FIGS. 4 and 6. A PLA 9 is not divided into sub-PLAs. That is, a conventional PLA is used as it is. A clock input terminal of the PLA 9 is connected to a clock control circuit 8, to which the clock pulse signal $\overline{CLK}$ and read signal RD are supplied, as shown in FIGS. 6(A) and 6(D), respectively. As is shown in FIGS. 6(B) and 6(D), during the read signal RD is held at H level, the clock control circuit switches the output thereof to L level in synchronism with the rise of the clock pulse signal $\overline{CLK}$. Input data is supplied to an input data terminal IN of the PLA 9. As shown in FIG. 6(C), the PLA 9 is discharged only when the read signal RD is active (H level), and is kept in the precharged state during a time when the read signal RD is kept at L level.

It is extremely important that PLAs and sub-PLAs are kept in the precharged state during the time when they are not selected. The reason for this will be described in detail later.

A description is given of a preferred embodiment of the present invention with reference to FIGS. 7(A) through 11(B). The illustrated embodiment of the present invention is based on combination of FIGS. 3 and 5. A PLA 11 has an input of 28 bits, an output of 23 bits, and 1653 product term lines. Functions available by the PLA 11 are divided into 10 functions of A through J, as shown in FIG. 9. The available functions A through J are achieved by divided 13 sub-PLAs $5_1$ through $5_{13}$, each of which includes 131 product terms. In FIG. 9, the sub-PLA $5_2$ is composed of 27 product terms relating to function A, and 104 product terms relating to function B. Functions A and B achieved by the sub-PLA $5_2$ can be separately selected. When function A is designated, both the PLAs $5_1$ and $5_2$ are selected. Similarly, the sub-PLA $5_3$ includes 28 product terms relating to function B, and 103 product terms relating to function C.

The clock input terminals CLK of the sub-PLAs $5_1$ through $5_{13}$ are connected to output terminals of corresponding 3-input NAND gates $12_1$ through $12_{13}$. Each of the NAND gates $12_1$ through $12_{13}$ is supplied with the clock pulse signal $\overline{CLK}$ and the read signal RD. The remaining input terminals of the NAND gates $12_1$ through $12_{13}$ are connected to the output terminals of the corresponding decoders $6_1$ through $6_{13}$. The decoders $6_1$ through $6_{13}$ are supplied with 6 bits out of the 28-bit input data to be supplied to the input data terminals IN of the sub-PLAs $5_1$ through $5_{13}$. Output terminals OUT of the sub-PLAs $5_1$ through $5_{13}$ are connected to gates of n-channel metal oxide semiconductor (MOS) transistors $14_1$ through $14_{13}$ through inverters $13_1$ through $13_{13}$, respectively. The NAND gates $12_1$ through $12_{13}$ generate clock pulse signals CLK1 through CLK13, respectively. The sources of the MOS transistors $14_1$ through $14_{13}$ are connected to ground (a negative power source), and drains thereof are mutually connected to thereby form a wired OR logic. The drains of the MOS transistors $14_1$ through $14_{13}$ are connected to a precharge circuit 16.

Figure 7A:
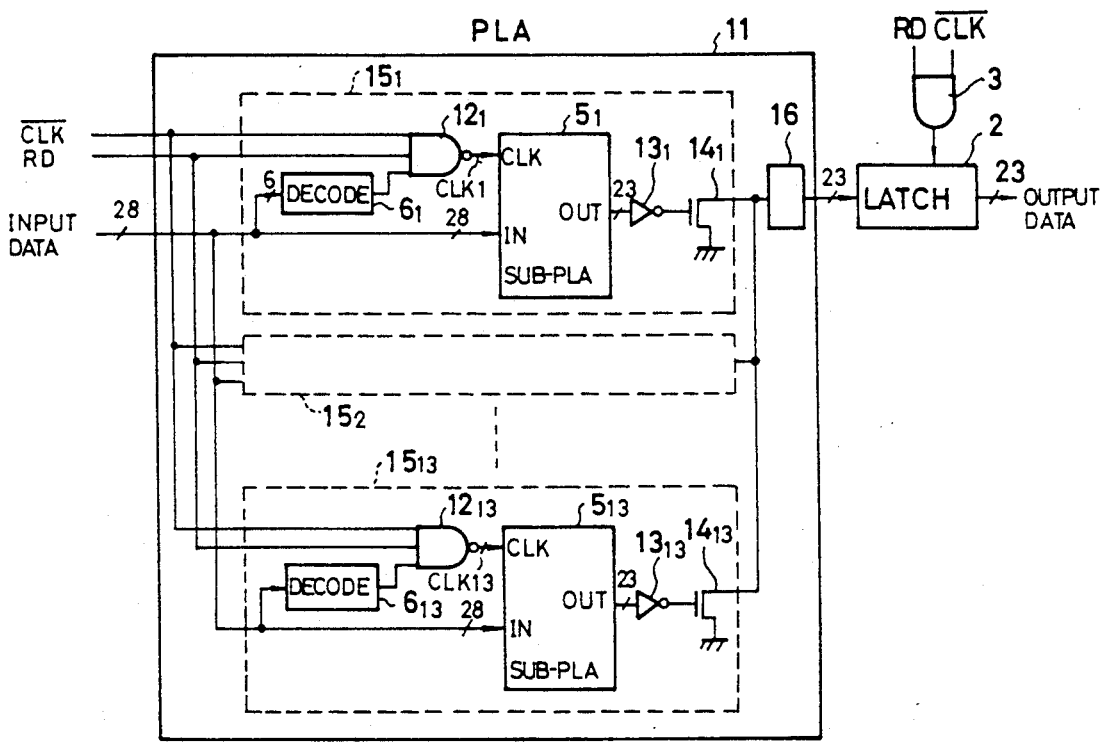
FIG. 7A is a block diagram of a preferred embodiment of the present invention.
Figure 7B:
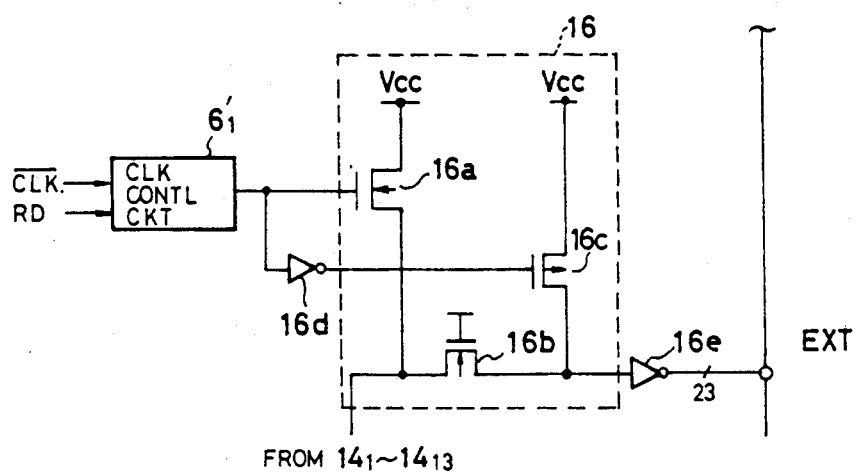
FIG. 7B is a circuit diagram of a precharge circuit and its peripheral circuit thereof used in the embodiment of FIG. 7A.

FIG. 7B is a circuit diagram of the precharge circuit 16 and its peripheral circuit. As is illustrated, the precharge circuit 16 is made up of n-channel MOS transistors 16a, 16b, and a p-channel MOS transistor 16c. A clock control circuit $6_1'$ has a function identical to the clock control circuit 8 shown in FIG. 4. The output terminal of the clock control circuit $6_1'$ is connected to the gate of the MOS transistor 16a, and the gate of the MOS transistor 16c through an inverter 16d. The source of the MOS transistor 16a and the drain of the MOS transistor 16c are coupled to each other through the MOS transistor 16b. The drain of the MOS transistor 16c is coupled to an external terminal EXT of the PLA 11 through an inverter 16e. When no read signal RD is supplied to the clock control circuit $6_1'$, it continues to output H level as shown in FIGS. 6(B) and 6(D). Therefore, during this time, the input terminal of the inverter 16e is supplied with the Vcc voltage (H level), and therefore, the external terminal EXT is kept at L level. In other words, the output lines of the sub-PLAs $5_1$ through $5_{13}$ are held in the precharged state when they are not selected. If the output lines of sub-PLAs $5_1$ through $5_{13}$ are not precharged during the time when they are not selected, the output lines may be in the floating state. Thereby, discharge transistors provided in the sub-PLAs $5_1$ through $5_{13}$ are turned ON, and a DC path is formed. As a result, there is a possibility that the discharge transistors may be damaged due to the formation of DC path.

The output terminal EXT of the PLA 11 is connected to the latch circuit 2, which is controlled by the AND gate 3. The latch circuit 2 and NAND gate 3 shown in FIG. 7A are the same as those shown in FIG. 1.

Figure 10A:
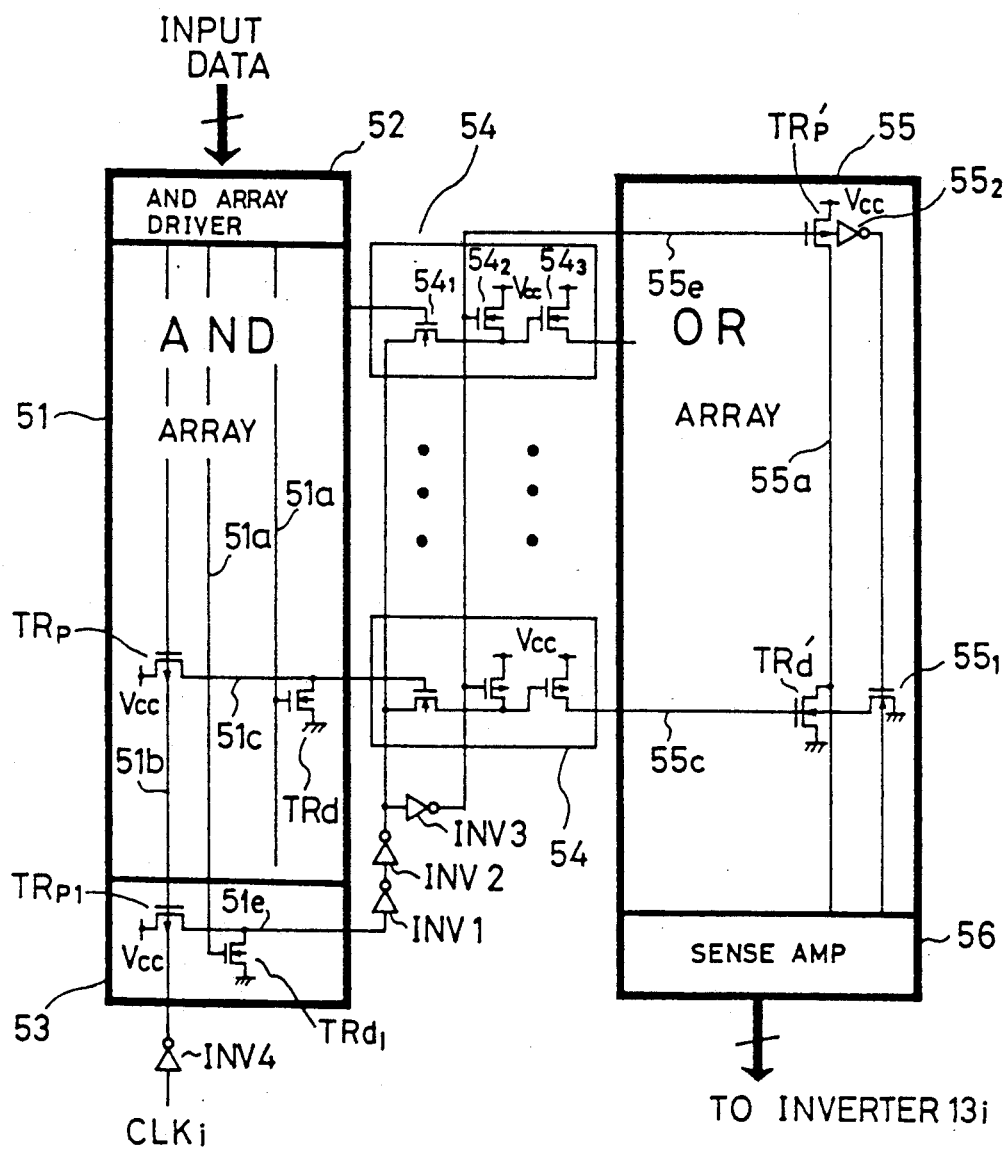
FIG. 10A is a circuit diagram of each sub-PLA used in the embodiment of FIG. 7A.
Figure 10B:
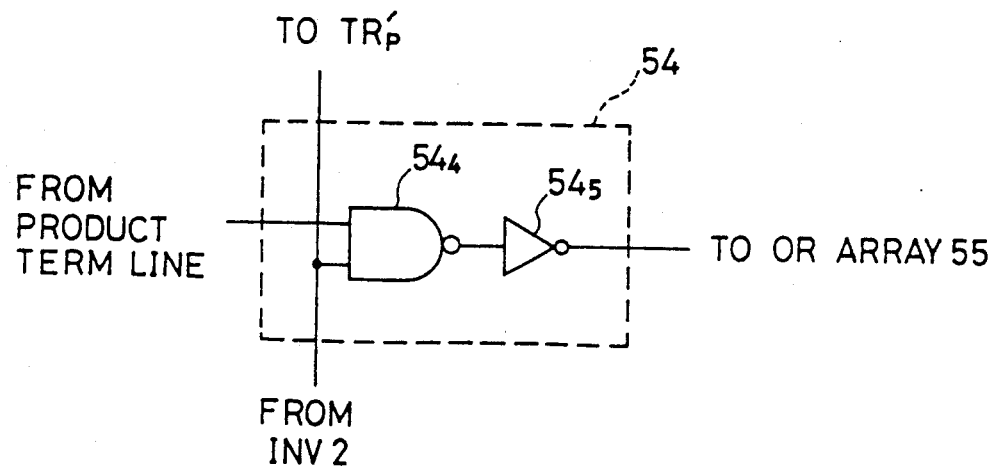
FIG. 10B is a circuit diagram of an OR array driver used in the circuit shown in FIG. 10A.

FIG. 10A illustrates an example of the internal structure for each of the sub-PLAs $5_1$ through $5_{13}$. The input data is supplied to an AND array 51 through an AND array driver 52, which includes a plurality of precharge transistors TRp and discharge transistors TRd. In the illustrated example, the precharge and discharge transistors TRp and TRd are of p- and n-channels, respectively. Gates of the precharge transistors TRp are connected to a line 51b, to which the related clock pulse signal CLKi (i=1-13) derived from the corresponding NAND gate 12i is supplied through an inverter INV4. Drains and sources of the precharge transistors TRp are connected to product term lines 51c and the positive power source Vcc, respectively. The product term lines 51c are connected to corresponding OR array drivers 54 of conventional type. Each of the OR array drivers 54 is made up of an n-channel MOS transistor $54_1$, and p-channel MOS transistors $54_2$ and $54_3$. The equivalent circuit of each of the OR array drivers 54 is illustrated in FIG. 10B. Each OR array driver 54 is composed of an NAND gate $54_4$ and an inverter $54_5$.

Input lines 51a extending from the AND array driver 52 are connected to gates of the corresponding discharge transistors TRd. A timing circuit 53 is made up of a precharge transistor $TRp_1$ and a discharge transistor $TRd_1$, which are connected to a control line 51e. The control line 51e is coupled to the gates of the transistors $54_2$ of the OR array drivers 54 through inverters INV1, INV2 and INV3. The control line 51e is also coupled to the sources of the transistors $54_1$ of the OR array drivers 54 through the inverters INV1 and INV2. Product term lines 55c extending from the OR array drivers 54 are connected to gates of discharge transistors TRd' of n-channel MOS transistors provided in an OR array 55. The product term lines 55c are also connected to drains of n-channel MOS transistors $55_1$. The output terminal of the inverter INV3 is connected to the gates of precharge transistors TRp' and an inverter $55_2$. In FIG. 10A, one of the precharge transistors TRp' is illustrated for convenience' sake. The output terminal of the inverter INV $55_2$ is connected to the gates of the transistors $55_1$. Output lines 55a extend from the precharge transistors TRp', to which discharge transistors TRd' are connected, as shown in FIG. 10A. Output signals of the OR array 55 are supplied to a sense amplifier 56, which is connected to the corresponding inverter 13i (i=1-13) shown in FIG. 7A.

A description is given of operation of the embodiment with reference to FIG. 8. During a time when the PLA 11 is not selected, the read signal RD is held at L level, and therefore the clock pulse signal CLKi derived from the NAND gates 12i is held at H level, as shown in FIGS. 8(B), 8(D) and 8(H). At this time, the gates of the precharge transistors TRp and TRp' shown in FIG. 10A are set to L level, and therefore these transistors are turned ON. Thereby, the product term lines 51c and the control line 51e are precharged up to the positive power source voltage Vcc (H level). The H level of the control line 51e is transferred to the inverters INV1 through INV3, and therefore the inverter INV3 outputs L level. This L level is supplied to the precharge transistors TRp'. On the other hand, the L level obtained at the output of the inverter INV3 is applied to the gates of the transistors $54_2$ of the OR array drivers 54. Therefore, the outputs of the transistors $54_2$ are switched to H level, and accordingly the transistors $54_3$ are turned OFF. As a result, the outputs of the transistors $54_3$ become the floating state. On the other hand, since the output of the inverter $55_2$ is held at H level, the transistors $55_1$ are turned ON, and therefore the lines 55c are switched to L level. As a result, the product term lines 55c in the OR array 55 are set to L level, and thereby the discharge transistors TRd' are kept OFF. In this way, the output lines 55a are precharged to H level, and all the sub-PLAs $5_1$ through $5_{13}$ are held in the precharged state.

At time $t_1$ shown in FIG. 8(B), the read signal RD is switched to H level, and the input data becomes indicative of function B as shown in FIG. 8(C). The input data relating to function B is decoded by the decoder $6_2$, which generates the control signal to be supplied to the NAND gate $12_2$. Then, the NAND gate $12_2$ generates the clock pulse signal CLK2 as shown in FIG. 8(D). Thereby, the sub-PLA $5_2$ is switched to the discharged state. Then discharge transistors TRd of the sub-PLA $5_2$ relating to the input data are turned ON based on the contents of the input data, and related product term lines in the AND array 52 are discharged, as shown in 8(E). Further, output lines 55a relating to the discharged product term lines 51c are discharged through the corresponding discharge transistors TRd' in the OR array 55 of the sub-PLA $5_2$.

Similarly, the input data is decoded by the decoder $6_3$ relating to function B, which generates the control signal to be supplied to the NAND gate $12_3$, as shown in FIG. 8(F). Then, the discharge transistors TRd of the sub-PLA $5_3$ relating to the input data are turned ON, and related product term lines in the AND array 52 are discharged, as shown in 8(E). Further, output lines 55a relating to the discharge product term lines 55c are discharged through the corresponding discharge transistors TRd' of the sub-PLA $5_3$.

In this manner, the output signals of the sub-PLAs $5_2$ and $5_3$ are transferred to the latch circuit 2 through the inverters $13_2$, $13_3$, transistors $14_2$, $14_3$, and the precharge circuit 16. During this operation, the output signal of the PLAs $5_2$ and $5_3$ are inverted, and are then output to the latch circuit 2. Then the latch circuit 2 latches the output signal of the PLA 11 with a timing when both the read signal RD and the clock pulse signal $\overline{CLK}$ are held at H level.

During the time when the sub-PLAs $5_2$ and $5_3$ are selected, the remaining decoders $6_1$ and $6_4$ through $6_{13}$ generate no control signal. Therefore, the sub-PLAs $5_1$, and $5_4$ through $5_{13}$ are kept in the precharged state.

It is very important that PLAs or sub-PLAs which are not selected, are held in the precharged state. If the PLA shown in FIG. 4 is designed so as to start precharging when the read signal RD is supplied to the clock control circuit 8, a sufficient precharging time may be not obtained due to a delay of the read signal RD from the rise of the clock signal $\overline{CLK}$. If the PLA is not sufficiently precharged, an error in reading data may occur. In order to prevent the occurrence of error, the precharging must be done in synchronism with the next rise of the clock signal CLK. This leads to a delay of read operation. On the other hand, according to the aforementioned embodiment, currently selected sub-PLAs among the sub-PLAs $5_1$ through $5_{13}$ are held in the precharged state. Therefore, even when there exists some delay of time, data can be read out correctly when the read signal RD occurs.

Figure 1:
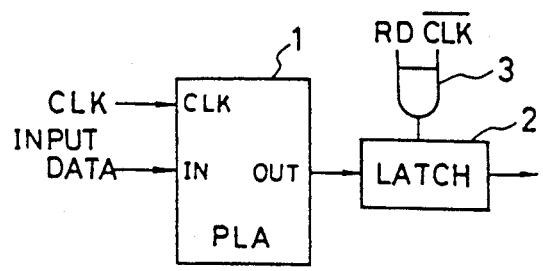
FIG. 1 is a block diagram of a conventional PLA.
Figure 2:
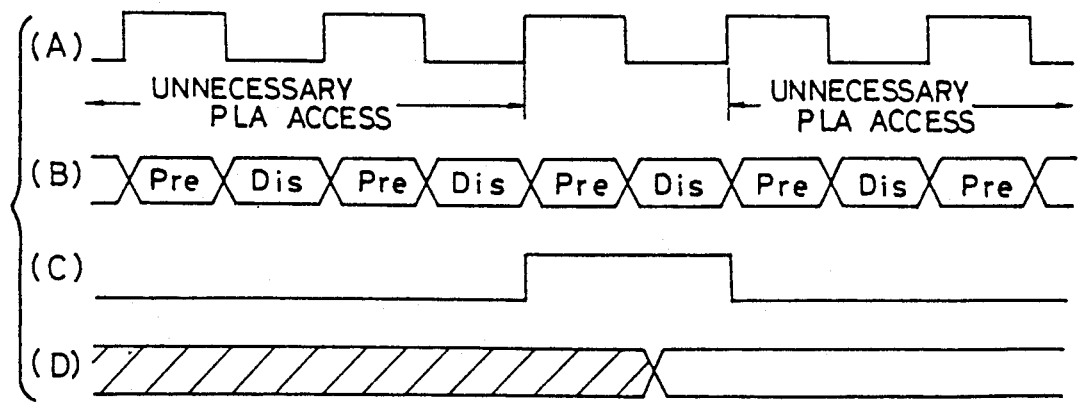
FIG. 2 is a timing chart of signals relating to the conventional PLA shown in FIG. 1.

The above-mentioned problems of the conventional PLA of FIG. 1 holds true for the aforementioned proposed improvement where no power is supplied to sub-PLAs which are currently selected. In the proposed improvement, it is impossible to rapidly precharge related sub-PLAs when selected. In other words, the precharging must be started after sub-PLAs are selected. With this structure, it is impossible to obtain sufficiently high operation speed.

The following is also reason to hold PLAs or sub-PLAs which are not currently selected in the precharged state. When data is read out from sub-PLAs, there is a possibility that data may be read out in error due to floating outputs relating to the remaining sub-PLAs which are not selected at current, if the remaining sub-PLAs are not held in the precharged state. For example, discharge transistors are turned ON due to the floating outputs and data of '0' may be output irrespective of being required to output '1'. The above problem can be prevented according to the aforementioned embodiment of the present invention.

Finally, an example of the structures of the decoders $6_1$ through $6_{13}$ are described. It is now assumed that functions A through J are indicated by 6 bits (S0, S1, S2, S3, S4, S5) which are low-order bits out of the 28-bit input data.

| A: 000000 | B: 000001 | C: 000010 |
|---|---|---|
| D: 000100 | E: 001000 | F: 010000 |
| G: 100000 | H: 100001 | I: 100010 |
| J: 100100 | | |

Figure 11A:
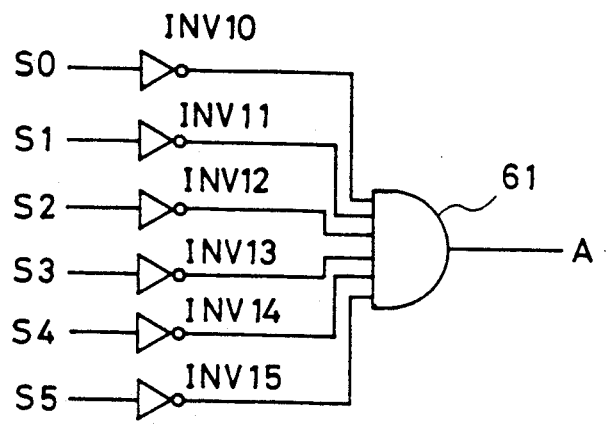
FIG. 11A is a circuit diagram of a decoder $6_1$ shown in FIG. 7A.
Figure 11B:
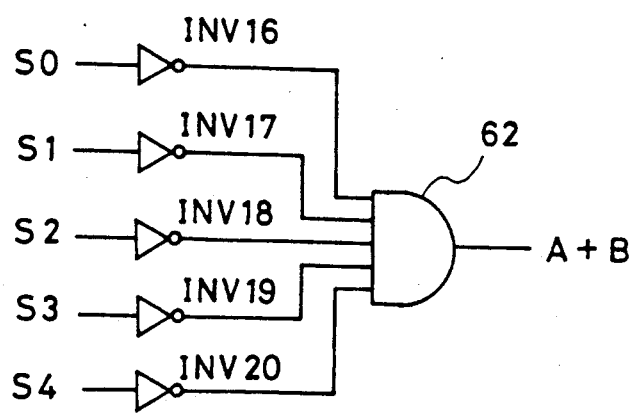
FIG. 11B is a circuit diagram of a decoder $6_2$ shown in FIG. 7A.

FIG. 11A is an example of the configuration for the decoder $6_1$. The decoder $6_1$ is made up of inverters INV10 through INV15, and an AND gate 61. FIG. 11B is an example of the configuration for the decoder $6_2$. The decoder $6_2$ is made up of inverters INV16 through INV20, and an AND gate 62. The sub-PLA $5_2$ has functions A and B. Therefore, all of the bits S0 through S4 are zero, the AND gate 62 generates the control signal to be supplied to the NAND gate $12_2$ shown in FIG. 7A.

In the embodiment of FIG. 7A, power consumption is reduced as small as one-thirteenth power consumption of the conventional PLA shown in FIG. 1. In the case, each of the sub-PLAs $5_1$ through $5_{13}$ is carried out for every m cycles, it is possible to reduce power consumption as small as approximately (1/13 m).

Although the structure of FIG. 7A has been described as a preferred embodiment, the structure of FIG. 3 or FIG. 5 is also effective to reduce power consumption.

The present invention is not limited to the embodiments, and variations and modifications may be made without departing from the scope of the present invention.

What is claimed is:

1. A programmable logic array comprising:
   a programmable logic array precharged and discharged in synchronism with a clock signal supplied thereto and outputting an operation result with respect to input data supplied thereto; and
   holding and switching means connected to said programmable logic array, said holding and switching means for holding the programmable logic array in a precharged state when said programmable logic array is not selected by setting said clock signal to a fixed level and said holding and switching means for switching said programmable logic array to a discharged state when said programmable logic array is selected by supplying said clock signal to said programmable logic array, so that said programmable logic array is discharged based on contents of said input data when selected and therein generates said operation result with respect to said input data.

2. A programmable logic array as claimed in claim 1, wherein said programmable logic array is divided into a plurality of sub-programmable logic arrays, and said holding and switching means is provided for each of the plurality of sub-programmable logic arrays.

3. A programmable logic array as claimed in claim 2, wherein said holding and switching means provided for each of the sub-programmable logic arrays comprises decoder means for decoding said input data to determined whether or not a corresponding sub-programmable logic array, which is one of said sub-programmable logic arrays, is selected, and clock control means, connected to said decoder means, for supplying the corresponding sub-programmable logic array with said clock signal only when the corresponding sub-programmable logic array is selected.

4. A programmable logic array as claimed in claim 3, wherein said decoder means decodes a part of said input data.

5. A programmable logic array as claimed in claim 2, wherein said programmable logic array is divided into the plurality of sub-programmable logic arrays, depending on functions achieved by said programmable logic array.

6. A programmable logic array as claimed in claim 1, wherein said programmable logic array is alternately switched to said discharged state and precharged state in synchronism with said clock signal only when said programmable logic array is selected.

7. A programmable logic array comprising:
   a programmable logic array precharged and discharged in synchronism with a clock signal supplied thereto and outputting an operation result with respect to input data supplied thereto, said programmable logic array is divided into a plurality of sub-programmable logic arrays; and
   holding and switching means connected to said programmable logic array, said holding and switching means for holding the programmable logic array in a precharged state when said programmable logic array is not selected by setting said clock signal to a fixed level and said holding and switching means for switching said programmable logic array to a discharged state when said programmable logic array is selected by supplying said clock signal to said programmable logic array, so that said programmable logic array is discharged based on contents of said input data when selected and therein generates said operation result with respect to said input data, said holding and switching means is provided for each of the plurality of sub-programmable logic arrays, and comprises
   decoder means for decoding said input data to determining whether or not a corresponding sub-programmable logic array, which is one of said sub-programmable logic arrays, is selected, and
   clock control means, connected to said decoder means, for supplying the corresponding sub-programmable logic array with said clock signal only when the corresponding sub-programmable logic array is selected during a time where a read signal defining a timing for outputting said operation result is supplied to said related clock control means.

8. A programmable logic array as claimed in claim 7, wherein said related clock control means comprises an NAND gate having first and second input terminals supplied with an external clock signal and said read signal, respectively, a third input terminal connected to the corresponding decoder means, and an output terminal through which said clock signal, derived from said external clock signal and said read signal, is output.

9. A programmable logic array comprising:
a programmable logic array precharged and discharged in synchronism with a clock signal supplied thereto and outputting an operation result with respect to input data supplied thereto, said programmable logic array is divided into a plurality of sub-programmable logic arrays, the plurality of sub-programmable logic arrays have output terminals through which corresponding operation results are output, and said output terminals of the plurality of sub-programmable logic arrays are coupled to corresponding transistors which are mutually connected to thereby form a wired OR logic output; and
holding and switching means connected to said programmable logic array, said holding and switching means for holding the programmable logic array in a precharged state when said programmable logic array is not selected by setting said clock signal to a fixed level and said holding and switching means for switching said programmable logic array to a discharged state when said programmable logic array is selected by supplying said clock signal to said programmable logic array, so that said programmable logic array is discharged based on contents of said input data when selected and therein generates said operation result with respect to said input data, said holding and switching means is provided for each of the plurality of sub-programmable logic arrays.

10. A programmable logic array comprising:
a programmable logic array precharged and discharged in synchronism with a clock signal supplied thereto and outputting an operation result with respect to input data supplied thereto, said programmable logic array is divided into a plurality of sub-programmable logic arrays;
holding and switching means connected to said programmable logic array, said holding and switching means for holding the programmable logic array in a precharged state when said programmable logic array is not selected by setting said clock signal to a fixed level and said holding and switching means for switching said programmable logic array to a discharged state when said programmable logic array is selected by supplying said clock signal to said programmable logic array, so that said programmable logic array is discharged based on contents of said input data when selected and therein generates said operation result with respect to said input data, said holding and switching means is provided for each of the plurality of sub-programmable logic arrays; and
precharge means for precharging a wired OR logic output during a time when said programmable logic array composed of the plurality of sub-programmable logic arrays is not selected.

11. A programmable logic array comprising:
a programmable logic array precharged and discharged in synchronism with a clock signal supplied thereto and outputting an operation result with respect to input data supplied thereto, said programmable logic array is divided into a plurality of sub-programmable logic arrays wherein the plurality of sub-programmable logic arrays are periodically selected; and
holding and switching means connected to said programmable logic array, said holding and switching means for holding the programmable logic array in a precharged state when said programmable logic array is not selected by setting said clock signal to a fixed level and said holding and switching means for switching said programmable logic array to a discharged state when said programmable logic array is selected by supplying said clock signal to said programmable logic array, so that said programmable logic array is discharged based on contents of said input data when selected and therein generates said operation result with respect to said input data, said holding and switching means is provided for each of the plurality of sub-programmable logic arrays.

12. A programmable logic array comprising:
a programmable logic array precharged and discharged in synchronism with a clock signal supplied thereto and outputting an operation result with respect to input data supplied thereto; and
holding and switching means connected to said programmable logic array, said holding and switching means for holding the programmable logic array in a precharged state when said programmable logic array is not selected by setting said clock signal to a fixed level and said holding and switching means for switching said programmable logic array to a discharged state when said programmable logic array is selected by supplying said clock signal to said programmable logic array, so that said programmable logic array is discharged based on contents of said input data when selected and therein generates said operation result with respect to said input data, said holding and switching means generates a fixed voltage of a high level when said programmable logic array is not selected.

13. A programmable logic array comprising:
a programmable logic array precharged and discharged in synchronism with a clock signal supplied thereto and outputting an operation result with respect to input data supplied thereto; and
holding and switching means connected to said programmable logic array, said holding and switching means for holding the programmable logic array in a precharged state when said programmable logic array is not selected by setting said clock signal to a fixed level and said holding and switching means for switching said programmable logic array to a discharged state when said programmable logic array is selected by supplying said clock signal to said programmable logic array, so that said programmable logic array is discharged based on contents of said input data when selected and therein generates said operation result with respect to said input data, wherein said holding and switching means receives an external clock signal and a read signal, and wherein when said read signal is supplied thereto, said holding and switching means supplies said programmable logic array with said external clock signal as said clock signal, and therein switches said programmable logic array to the discharged state where said programmable logic array is discharged based on the contents of said input data, and said holding and switching means holds said programmable logic array in the precharged state when no signal is supplied to said holding and switching means.

14. A programmable logic array comprising:
a programmable logic array precharged and discharged in synchronism with a clock signal supplied thereto and outputting an operation result with respect to input data supplied thereto, said programmable logic array is divided into a plurality of sub-programmable logic arrays; and
holding and switching means connected to said programmable logic array, said holding and switching means for holding the programmable logic array in a precharged state when said programmable logic array is not selected by setting said clock signal to a fixed level and said holding and switching means for switching said programmable logic array to a discharged state when said programmable logic array is selected by supplying said clock signal to said programmable logic array, so that said programmable logic array is discharged based on contents of said input data when selected and therein generates said operation result with respect to said input data, said holding and switching means is provided for each of the plurality of sub-programmable logic arrays and comprises
decoder means for decoding said input data to determining whether or not a corresponding sub-programmable logic array, which is one of said sub-programmable logic arrays, is selected, and
clock control means, connected to said decoder means, for supplying the corresponding sub-programmable logic array with said clock signal only when the corresponding sub-programmable logic array is selected,
wherein said input data is composed of a plurality of bits, and wherein said decoder means comprises inverters individually provided for said plurality of bits and each having an input terminal supplied with corresponding one of said bits and an output terminal, and an AND gate having input terminals respectively connected to the output terminals of said inverters and an output terminal connected to said clock control means.

* * * * *